United States Patent [19]

Kimura et al.

[11] Patent Number: 4,746,971

[45] Date of Patent: May 24, 1988

[54] COMB-SHAPE RESPONSE FILTER HAVING ULTRASONIC DELAY LINE

[75] Inventors: Etsuji Kimura, Kamakura; Nobuhiro Yokoo; Shigeru Ueno, both of Yokohama, all of Japan

[73] Assignee: Asahi Glass Company Ltd., Tokyo, Japan

[21] Appl. No.: 878,851

[22] Filed: Jun. 26, 1986

[30] Foreign Application Priority Data

Jun. 27, 1985 [JP] Japan .................. 60-139148

[51] Int. Cl.⁴ .............................. H04N 9/78
[52] U.S. Cl. ..................... 358/31; 358/329; 333/167; 333/185
[58] Field of Search ............. 333/167, 176, 185, 141, 333/138; 358/320, 329, 337, 37, 39, 21 R, 31

[56] References Cited

U.S. PATENT DOCUMENTS

| | | |
|---|---|---|
| 3,728,476 | 4/1973 | Bates et al. .................. 333/174 X |
| 3,755,621 | 8/1973 | Dillenburger et al. ......... 333/141 X |
| 3,780,215 | 12/1973 | Shibata et al. ................ 358/37 |
| 4,149,181 | 4/1979 | Burdick et al. ................ 358/39 X |
| 4,206,474 | 6/1980 | Hermann et al. ............ 333/174 X |
| 4,402,006 | 8/1983 | Karlock ....................... 358/39 X |
| 4,506,238 | 3/1985 | Endoh et al. ................. 333/138 |
| 4,635,104 | 1/1987 | Hausdorfer ................... 358/39 X |

FOREIGN PATENT DOCUMENTS 0017533 10/1980 European Pat. Off. ............ 333/141
0028780 2/1984 Japan .................................. 358/39

Primary Examiner—Eugene R. Laroche
Assistant Examiner—Benny Lee
Attorney, Agent, or Firm—Oblon, Fisher, Spivak, McClelland & Maier

[57] ABSTRACT

A comb-shape filter which comprises an ultrasonic delay device, a branch line adapted to apply a part of an input for the ultrasonic delay device to its output terminal without passing through the ultrasonic delay device and a band elimination filter provided in the branch line.

7 Claims, 4 Drawing Sheets

COMB-SHAPE RESPONSE FILTER HAVING ULTRASONIC DELAY LINE

BACKGROUND OF THE INVENTION

1. Field of the Invention

The present invention relates to a comb-shape filter using an ultrasonic delay device.

2. Description of Technical Background

As shown in FIG. 3, a comb-shape filter using an ultrasonic delay device generally comprises an ultrasonic delay device consisting of an ultrasonic delay medium 1 and input and output electromechanical transducers 7, 8 (hereinbelow referred to simply as a transducer) attached some surfaces of the ultrasonic delay medium, and a branch line with an impedance element 2 which is connected between the input and output terminals of the ultrasonic delay device so that a part of an input signal is applied to the output terminal of the delay line through the impedance element 2 and without passing through the ultrasonic delay device.

A resistor 6 is to adjust the level of the signal passing through the branch line and a signal passing through the ultrasonic delay device. A resistor 9 is to match the output impedance of the ultrasonic delay device 1.

When an input electric signal is applied to the input terminal 10 of the comb-shape filter, it is converted into an ultrasonic wave at the input transducer 7. The ultrasonic wave is then transmitted in the ultrasonic delay medium 1 with a predetermined time delay, and is again converted into an electric signal at the output transducer 8 to become an output electric signal. On the other hand, a part of the input electric signal is applied to the output signal of the ultrasonic delay medium 1 through the impedance element 2. The part of the input electric signal is added to the output electric signal whereby an output electric signal having comb-shape filter characteristics is obtained from the output terminal 11.

Recently, improvement in video-equipments and picture quality have been needed particularly in the property of the comb-shape filter. For instance, there is the demand of a reproduced picture having a high resolution for a video tape recorder (VTR). It is therefore necessary to provide a television receiver to meet such demand. Resolution of the reproduced picture in the vertical direction depends on the number of scanning lines, and resolution in the horizontal direction largely depends on the number of horizontal stripes of a luminance signal factor. It is known that a high resolution can be obtained by increasing either or both of these numbers.

A video signal in the NTSC system is formed by a luminance signal factor 17 and a color signal factor 18 and has a band width as high as about 4 MHz as shown in the response frequency characteristic diagram of FIG. 4. Accordingly, a conventional comb-shape filter possesses frequency characteristics as shown in FIG. 5. Since the input and output transducers 7, 8 of the ultrasonic delay device indicate bandpass filter characteristics as shown in FIG. 6, the frequency characteristics of the conventional comb-shape filter is obtained by giving to the signal passing through the branch line frequency characteristics which is declined toward the right side, by using an inductance element and/or other elements as the impedance element 2.

Thus, the conventional comb-shape filter having a narrow band width could not provide a sufficient number of horizontal stripes, and accordingly, it was difficult to attain a high resolution.

On the other hand, for portable video-equipments such as color television receivers, there is a strong demand to miniaturize of the equipments. Likewise, miniaturization is requied for the comb-shape filter as a part of the portable video-equipment.

SUMMARY OF THE INVENTION

It is an object of the present invention to eliminate the disadvantage of the conventional comb-shap filter and to provide an improved comb-shape filter of a small size and providing a reproduced picture having a high resolution.

An object of the present invention is to provide a comb-shape filter comprises an ultrasonic delay device, a branch line adapted to apply a part of an input signal for the ultrasonic delay device to its output terminal without passing through the ultrasonic delay device and a band elimination filter provided in the branch line.

Another object of the present invention is to provide a comb-shape filter which comprises an ultrasonic delay device, a branch line adapted to apply a part of an input signal for the ultrasonic delay device to its output terminal without passing through the ultrasonic delay device, a band elimination filter provided in the branch line and at least one element provided in the branch line, which is received in or mounted on a package for encapsulating the ultrasonic delay device, or is placed on a circuit board integrally connected to the package.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENT

Figure 1:
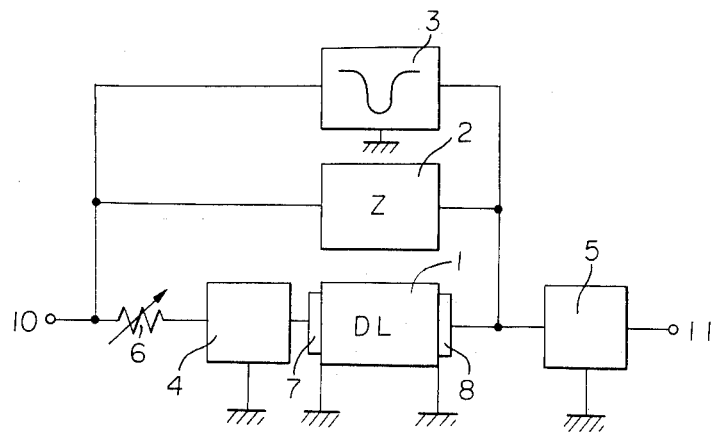
FIG. 1 is a block diagram showing an embodiment of the comb-shape filter according to the present invention.

Preferred embodiments of the present invention will be described with reference to drawings wherein the same reference numerals designate the same or corresponding parts. In FIG. 1, a level adjusting resistor 6, an impedance matching circuit 4, an ultrasonic delay medium 1 attached with an input transducer 7 at its one surface and an output transducer 8 at its same or other surface and an impedance matching circuit 5 are serially connected in this order between input and output terminals 10, 11. Accordingly, an electric signal input at the input terminal 10 is output from the output terminal 11 through the above-mentioned elements.

A first branch line including an impedance element 2 and a second branch line including a band elimination filter 3 are respectively connected in parallel to the line having a serial connection of the resistor 6, the impedance matching circuit 4 and the ultrasonic delay medium 1.

Figure 7:
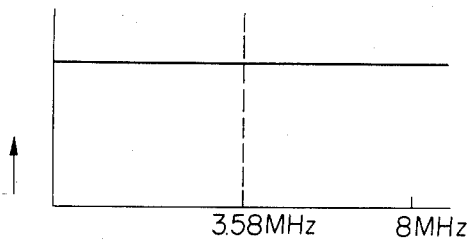
FIGS. 7 and 8 are respectively response frequency characteristic diagrams of each element used in the comb-shape filter of the present invention.
Figure 8:
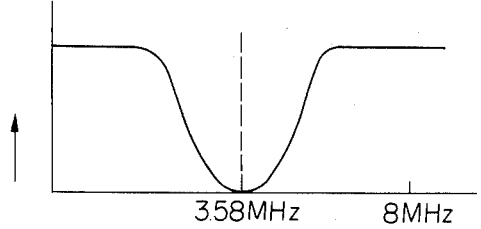

The impedance element 2 possesses flat response frequency characteristics as shown in FIG. 7, and the band elimination filter 3 possesses response frequency characteristics as shown in FIG. 8.

The impedance element 2 and the band elimination filter 3 may be formed by only a passive element or may include an active element.

The resistor 6 may be a variable type or a fixed type. Further, an amplifier may be connected in series to and at the input side of the resistor 6.

Figure 2:
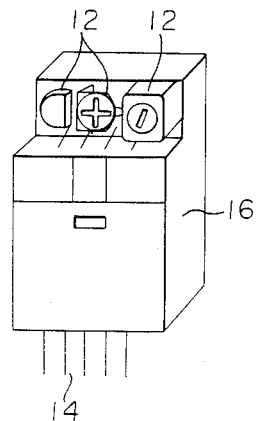
FIG. 2 is a perspective view schematically illustrated of another embodiment of the present invention.
Figure 3:
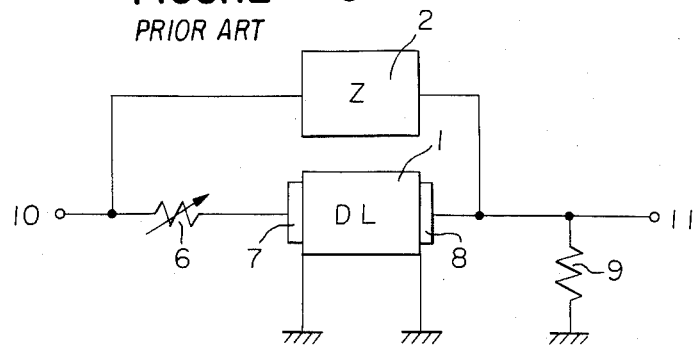
FIG. 3 is a block diagram of a conventional comb-shape filter.
Figure 4:
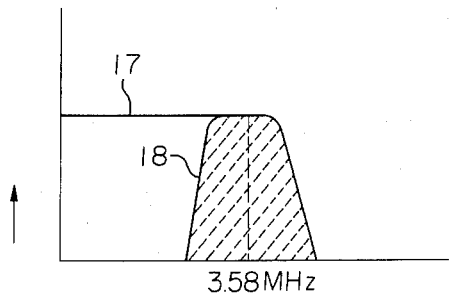
FIG. 4 is a response frequency characteristic diagram of a video signal in the NTSC system.
Figure 5:
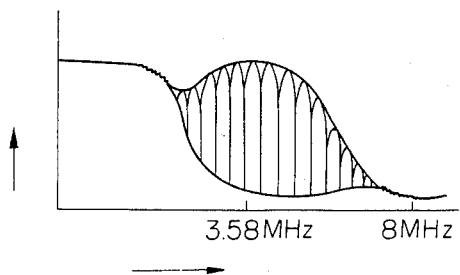
FIG. 5 is a response frequency characteristic diagram of the conventional device.

FIG. 2 is a perspective view showing another embodiment of the present invention. In this embodiment, circuit elements such as a transistor, a coil, a resistor, a capacitor which constitute the band elimination filter 3 are mounted on a part of a package 16 for the ultrasonic delay device. Terminal pins 14 are projected from the bottom of the package 16 to input a electric signal from outside circuits into the circuit elements 12 and the ultrasonic delay device 1 which is fixed to the package together with the circuit elements 12 or to output an electric signal from the elements to outside circuits.

Figure 10:
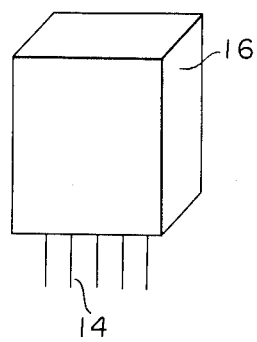
FIGS. 10–12 are respectively perspective views showing other embodiments of the present invention.

FIG. 10 shows another embodiment of the present invention in which all circuit elements and the ultrasonic delay medium are contained in the package 16 for the ultrasonic delay device.

Figure 11:
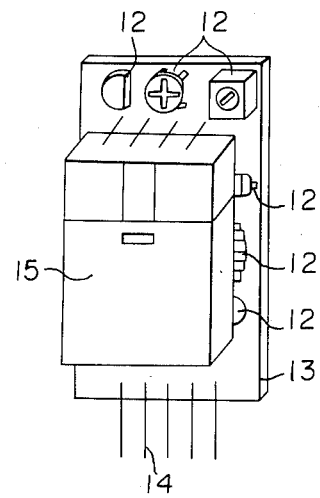
Figure 12:
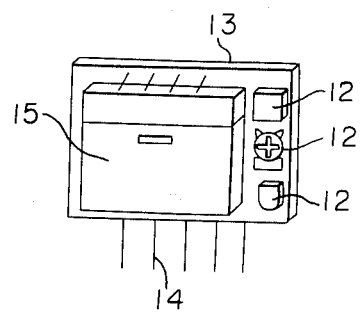

FIGS. 11 and 12 are respectively diagrams showing still other embodiments of the present invention. In the embodiments, an ultrasonic delay device 15 is firmly fixed on a circuit board 13 on which circuit elements 12 are mounted, and terminal pins 14 are attached to the circuit board 13 so that an electric signal is input from outside circuits to the ultrasonic delay medium 15 and the electric elements 12 through the terminal pins 14 and vice versa.

Figure 6:
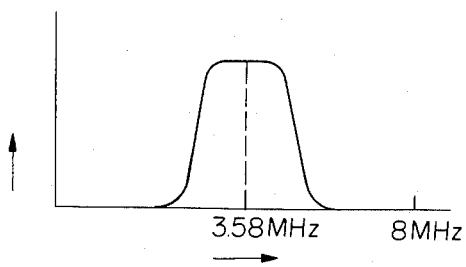
FIG. 6 is a response frequency characteristic diagram of an ultrasonic delay device.

Referring to the comb-shape filter shown in FIG. 1, an input signal applied to the input terminal 10 is input into the input transducer 7 of the ultrasonic delay device through the resistor 6 and the impedance matching circuit 4. The input signal is converted from an electric signal into an ultrasonic wave at the input transducer 7. The ultrasonic wave is transmitted in the ultrasonic delay medium 1 with a predetermined time delay and then, is again converted into an electric signal at the output transducer 8. The output signal passed through the line including the ultrasonic delay medium 1 assumes the response frequency characteristics as shown in FIG. 6 owing to the frequency characteristics of the input and output transducers 7, 8, in addition that the output signal is delayed for a predetermined time.

Figure 9:
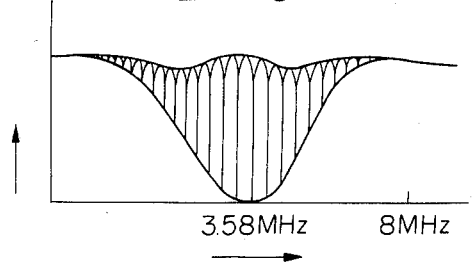
FIG. 9 is a response frequency characteristic diagram of an embodiment of the present invention.

On the other hand, a part of the input signal is passed through the first branch line including the impedance element 2 and the second branch line including the band elimination filter 3, whereby the input signals passing through the branch lines possess response frequency characteristics as shown in FIGS. 7 and 8 respectively. The signals are composed with the signal having a predetermined time delay at the output terminal of the output transducer 8, as shown in FIG. 9. Accordingly, the output signal at the output side of the impedance matching circuit becomes an output signal wherein the upper envelope curve indicates substantially flat response frequency characteristics. The ripple of the envelope curve is acceptable in practical use if it is within 3 dB. However, the ripple should preferably be within 1.5 dB. Further, it is desirable that the band width in the comb-shape filter characteristics is ±0.5 MHz or so with respect to the center frequency of 3.58 MHz.

Figure 13:
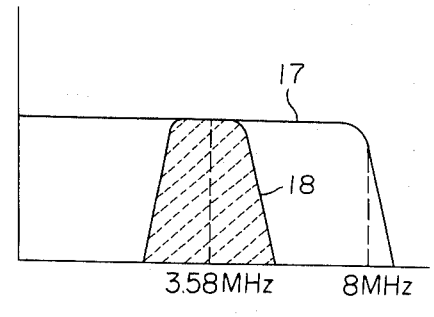
FIG. 13 is a response frequency characteristic diagram showing an embodiment of a video signal applicable to the comb-shape filter of the present invention.

As described before, the band width of the video signal in the NTSC system is about 4 MHz. Accordingly, when the video signal in the NTSC system is applied to the comb-shape filter of the present invention, remarkable advantage can not be obtained except that rotation in phase can be small. However, a great advantage can be obtained when it is applied to a video system using a video camera (VC) and a VRT. For instance, it is possible to use a video signal having a wide band width as shown in FIG. 13. When the video signal having a wide band width is used, the number of horizontal stripes of a luminance signal factor can be increased, whereby there is obtainable a reproduced picture having a high resolution in the horizontal direction. Thus, when the comb-shape filter having the wide band characteristics of the present invention is used, a great advantage can be obtained.

Further, even when the video signal in the NTSC system is used and a picture image recorded in a VTR is reproduced by a television received, it is possible to prevent deterioration of the reproduced picture by using the comb-shape filter of the present invention.

As described above, in the comb-shape filter of the present invention, at least a band elimination filter is provided in a branch line which is connected in parallel to the ultrasonic delay device, and the circuit elements are made integral with the ultrasonic delay device. Accordingly, when the comb-shape filter is used in a television receiver, a reproduced picture having a high resolution in the horizontal direction can be obtained and the size of the comb-shape filter can be small as a whole.

What is claimed is:

1. A filter having a comb-shaped response, comprising:
    an input terminal;
    an output terminal;
    an ultrasonic delay device coupled to said input terminal and having an output coupled to said output terminal;
    an impedance element connected in parallel with said ultrasonic delay device between said input terminal and said output of said ultrasonic delay device;
    a band elimination filter connected in parallel with said ultrasonic delay device and in parallel with said impedance element, between said input terminal and said output of said ultrasonic delay device.

2. The filter according to claim 1, wherein elements comprising said band filter are received in a package for encapsulating said ultrasonic delay device.

3. The filter according to claim 1, wherein elements comprising said band filter are mounted on a package for encapsulating said ultrasonic delay device.

4. The filter according to claim 1, wherein elements comprising said band filter are placed on a circuit board integrally connected to a package for encapsulating said ultrasonic delay device.

5. A filter according to claim 1, further comprising: an adjustable resistor coupled in series between said ultrasonic delay device and said input terminal.

6. A filter according to claim 1, further comprising: an impedance matching circuit connected between said adjustable resistor and said ultrasonic delay device and in series therewith.

7. A filter according to claim 1, further comprising an impedance matching circuit connected between said output of said ultrasonic delay device and said output terminal.

* * * * *